United States Patent [19]
Saso

[11] Patent Number: 5,991,162
[45] Date of Patent: Nov. 23, 1999

[54] HIGH-FREQUENCY INTEGRATED CIRCUIT DEVICE AND MANUFACTURE METHOD THEREOF

[75] Inventor: Toru Saso, Tokyo, Japan

[73] Assignee: NEC Corporation, Tokyo, Japan

[21] Appl. No.: 09/105,252

[22] Filed: Jun. 26, 1998

[30] Foreign Application Priority Data

Jun. 27, 1997 [JP] Japan .................................. 9-172385

[51] Int. Cl.⁶ .................................................. H05K 7/02
[52] U.S. Cl. ..................... 361/760; 361/761; 361/748; 361/762; 361/763; 361/764; 361/807; 257/700; 257/702; 257/704
[58] Field of Search ................................. 361/760, 748, 361/761, 762, 763–765, 772, 773, 783, 807, 809, 812, 816, 818, 820; 257/635, 666–668, 700, 702, 704, 758, 759, 774, 779

[56] References Cited

U.S. PATENT DOCUMENTS

| | | | |
|---|---|---|---|
| 4,965,702 | 10/1990 | Lott et al. | 361/764 |
| 5,355,102 | 10/1994 | Kornrumpf et al. | 333/33 |
| 5,483,100 | 1/1996 | Marrs et al. | 257/700 |
| 5,727,310 | 3/1998 | Casson et al. | 29/830 |

FOREIGN PATENT DOCUMENTS

| | | |
|---|---|---|
| 4-162454 | 6/1992 | Japan . |
| 6-232287 | 8/1994 | Japan . |
| 8-78795 | 3/1996 | Japan . |
| 8-321567 | 12/1996 | Japan . |

*Primary Examiner*—Leo P. Picard
*Assistant Examiner*—David Foster
*Attorney, Agent, or Firm*—Sughrue, Mion, Zinn, Macpeak & Seas, PLLC

[57] ABSTRACT

A high-frequency power module is provided which has excellent heat radiating characteristics for carrying heat away from a power device element contained in the module. Also, the module can be miniaturized to a size of about 0.2 $cm^3$ and can be inexpensively manufactured. In order to produce the module, a multilayer substrate for a high-frequency integrated circuit device is provided. The substrate contains a first substrate layer, a first metal layer, a cavity, and a first through hole. The first substrate layer has a first surface on which a first wiring layer is formed, and the first metal layer is formed at least indirectly on the first substrate layer. The cavity is formed through the first substrate layer such that an exposed portion of the first metal layer is exposed, and the first through hole is provided at the exposed portion of the first metal layer and extends through the first metal layer.

17 Claims, 6 Drawing Sheets

HIGH-FREQUENCY INTEGRATED CIRCUIT DEVICE AND MANUFACTURE METHOD THEREOF

FIELD OF THE INVENTION

The present invention relates to a high-frequency integrated circuit device. More particularly, the present invention relates to a high-frequency integrated circuit device suitable for a transmission power amplifier/module of a cellular phone or similar device.

BACKGROUND OF THE INVENTION

A conventional high-frequency integrated circuit device having a multilayer wiring plate is disclosed in Japanese Patent Application Laid-Open No. Sho 63-292660 and is illustrated in FIG. 4. As shown in the figure, the device primarily contains a laminated body 25 which is formed by sequentially laminating layers of an insulating plate 24 and thin metal layers 26. Specifically, a first insulating plate 24 is formed as the bottom layer, and a first thin metal layer 26 is formed on the first insulating plate 24. Then, a second insulating plate 24 and a second thin metal layer 26 are sequentially formed on the first thin metal layer 26, and a third insulating plate 24 is formed on the second thin metal layer 26. Cavities are formed in the third insulating plate 24 to expose portions 27 of the second thin metal layer 26, and electronic components 28 are adhered to the exposed portions 27. Similarly, cavities are formed in the first insulating plate 24 to expose portions 27 of the first thin metal layer 26, and electronic components 28 are adhered to the exposed portions 27.

The heat generated by the electronic components 28 is transmitted directly to the thin metal layers 26 and travels within the metal layers 26 only in a transverse direction (i.e. the horizontal direction in FIG. 4). However, if a PoGaAsFET or similar power device is adhered to the exposed portions 27 of the thin metal layers 26, the metal layers 26 could not sufficiently radiate the heat away from the power device. Therefore, the size of the metal layers 26 would need to be enlarged. As a result, the device in FIG. 4 cannot be used to create a micro power amplifier/module which houses a power device and which has a size of approximately 0.2 $cm^3$.

FIG. 5 is a sectional view of a multilayer printed wiring plate disclosed in Japanese Patent Application Laid-Open No. Hei 7-50489. As shown in the figure, the wiring plate comprises a laminated body 29 having insulating plate layers. The laminated body 29 also contains pads 30 on its surface, and through holes 31 are formed though the pads 30. Also, a chip carrier integrated circuit ("IC") 32 is mounted on the pads 30 over the through holes 31, and the heat generated by the chip carrier IC 32 is radiated via the pads 30 and the through holes 31 to the atmosphere. Also, some of the heat which radiates via the through holes is transmitted from the holes 31 in a transverse direction (i.e. the horizontal direction in FIG. 5) to thin earth or grounding layers 33 which are laminated between the insulating layers in the laminated body 29. Then, the heat is radiated from the earth layers 33 to the atmosphere.

In the conventional device above, only the thin earth layers 33 and the radiating through holes 31 radiate heat away from the chip carrier IC 32. Therefore, in order to adequately radiate heat away from a PoGaAsFET or another power device element, the thin earth layers 33 need to be enlarged or increased in number. However, if the size or number of the layers 33 is increased, the device cannot be used to form a micro power amplifier/module of having a volume of about 0.2 $cm^3$.

Another conventional micro power amplifier/module is shown in FIG. 6. As shown in the figure, the module comprises a ceramic substrate 35 which is provided with a wiring layer 8a, and a thick external radiating plate 36 is adhered to a rear surface of the substrate 35. Also, cavities are formed in the ceramic substrate 35 to expose a portion 37 of the radiating plate 36, and a power device element 2 is mounted on the exposed portion 37.

Although heat can be adequately radiated away from the power device element 2 via the plate 36, the module must be assembled by incorporating the thick external radiating plate 36 into the module. Therefore, the process by which the module is manufactured is complicated and expensive. As a result, the conventional device cannot be used to produce an inexpensive micro power amplifier/module which has a volume of approximately 0.2 $cm^3$.

As described above, the conventional devices shown in FIGS. 4 and 5 cannot sufficiently radiate heat away from a power device element without enlarging the size of the metal layers contained in the laminated body. As a result, the size of such devices must be dramatically increased, and a micro power amplifier/module which has a volume of about 0.2 $cm^3$ and which houses a PoGaAsFET or similar power device element cannot be produced.

Also in the conventional device shown in FIG. 6, the thick radiating plate is not laminated in a laminated body, but externally incorporated into the device. Thus, the manufacturing process of the conventional device is complicated and expensive.

SUMMARY OF THE INVENTION

An object of the invention is to provide a high-frequency integrated circuit device comprising a multilayer substrate structure in which thick plate interlayers are laminated, which can be manufactured inexpensively, and which can produce a micro power amplifier/nodule having a size of about 0.2 $cm^3$.

In order to achieve the above and other objects, a multilayer substrate for a high-frequency integrated circuit device is provided. The substrate comprises: a first substrate layer having a first surface on which a first wiring layer is formed; a first metal layer formed at least indirectly on said first substrate layer; a cavity formed through said first substrate layer such that a portion of said first metal layer is exposed; and a first through hole provided at said exposed portion of said first metal layer and extending through said first metal layer.

In order to further achieve the above and other objects, a method for manufacturing a multilayer substrate for a high-frequency integrated circuit device is provided. The method comprises the steps of: (a) forming a first substrate layer having a first surface; (b) forming a first wiring layer on said first surface of said first substrate layer; (c) forming a first metal layer at least indirectly on said first substrate layer; (d) forming a cavity through said first substrate layer such that an exposed portion of said first metal layer is exposed; and (e) forming a first through hole at said exposed portion of said first metal layer which extends through said first metal layer.

BRIEF DESCRIPTION OF THE DRAWINGS

The above objects and advantages of the present invention will become more apparent by describing in detail preferred embodiments thereof with reference to the attached drawing in which.

DETAILED DESCRIPTION OF THE PREFERRED EMBODIMENTS

The following description of the preferred embodiments discloses specific configurations and components. However, the preferred embodiments are merely examples of the present invention, and thus, the specific features described below are merely used to more easily describe such embodiments and to provide an overall understanding of the present invention. Accordingly, one skilled in the art will readily recognize that the present invention is not limited to the specific embodiments described below. Furthermore, the descriptions of various configurations and components of the present invention which would have been known to one skilled in the art are omitted for the sake of clarity and brevity.

Figure 1A:
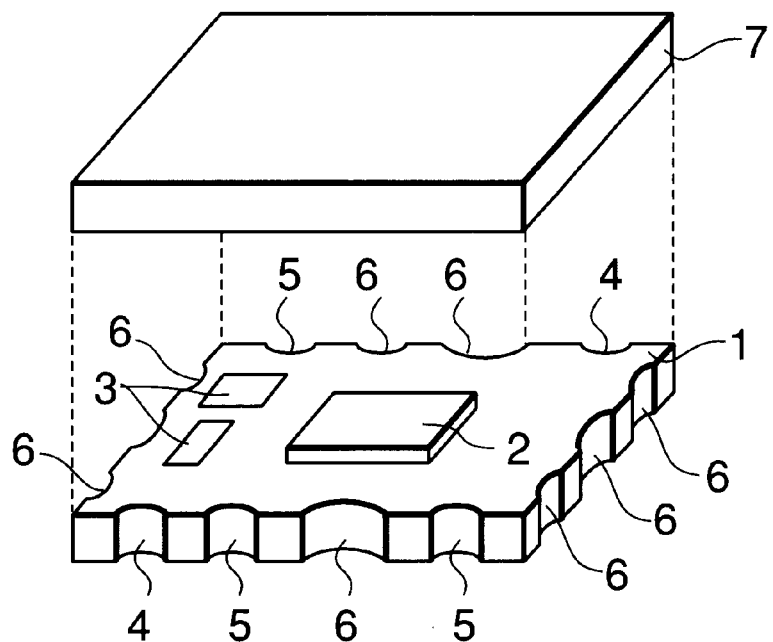
FIG. 1(a) is an exploded perspective view of a high-frequency integrated circuit device according to a first embodiment of the present invention.
Figure 1B:
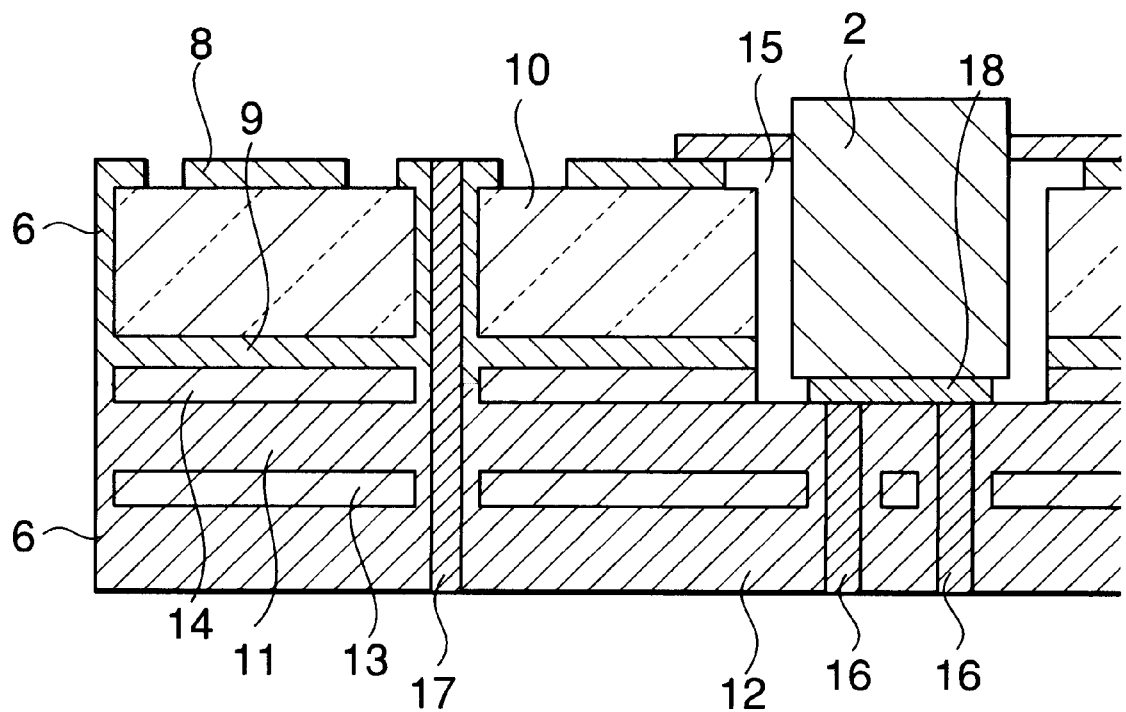
FIG. 1(b) is a cross sectional view of a high-frequency integrated circuit device according to the first embodiment of the present invention.

FIG. 1(a) shows an exploded perspective view of a high-frequency integrated circuit device according to a first embodiment of the present invention, and FIG. 1(b) shows a cross sectional view of the device. As shown in the figure, the device comprises a multilayer substrate 1, and a power device element 2 and other chip components 3 (i.e. a chip resistor, capacitor, etc.) are mounted on the substrate 1. Also, a side surface of the multilayer substrate 1 contains input/output terminal through holes 4, power terminal through holes 5, and radiating terminal through holes 6. Furthermore, in order to protect the substrate 1, an electro-magnetic shielding and inner protective metal cover 7 is provided over the upper surface of the substrate 1.

As shown in FIG. 1(b), the multilayer substrate 1 comprises a substrate layer (i.e. base material layer) 10, and circuit wiring layers (i.e. conductor layers) 8 and 9 which are disposed on the upper and lower surfaces of the base material layer 10. Also, an adhesive layer 14 is laminated on the conductor layer 9, and a metal layer 11 is laminated on the adhesive layer 14. A second base material layer 13 is laminated on the metal layer 11, and a second metal layer 12 is laminated on the base material layer 13.

Also, a recessed cavity 15 is formed in the multilayer substrate 1 by counter-boring the base material layer 10, the conductor layer 9, and the adhesive layer 14 until the metal layer 11 is exposed. After the cavity 15 is formed, the power device element 2 is directly mounted on the exposed portion of the metal layer 11. Also, the power device element 2 is usually sealed with resin and has a mounting face (i.e. a rear face) made of a metal layer. Therefore, the element 2 is typically bonded via solder 18 on the metal layer 11 within the cavity 15.

In addition thermal piers (i.e. radiating through holes) 16 are provided in the bottom surface of the cavity 15 and extend through the metal layer 11, the base material layer 13, and the metal layer 12. Also, the through holes 16 do not need to extend completely through the layers 11, 12, and 13, as long as they connect the metal layers 11 and 12. Thus, the upper portions of the through holes 16 contact the solder 18 which mounts the power device element 2 in the cavity 15. Also, multiple through holes 17 are provided in other areas of the multilayer substrate 1 and extend through all of the layers 8 to 14 of the substrate 1. Furthermore, through holes 6 are located at the side surfaces of the substrate 1. As shown in FIG. 1 (b), the through holes 16 and 17 may be filled with an insulating resin or other dielectric.

Figure 1C:
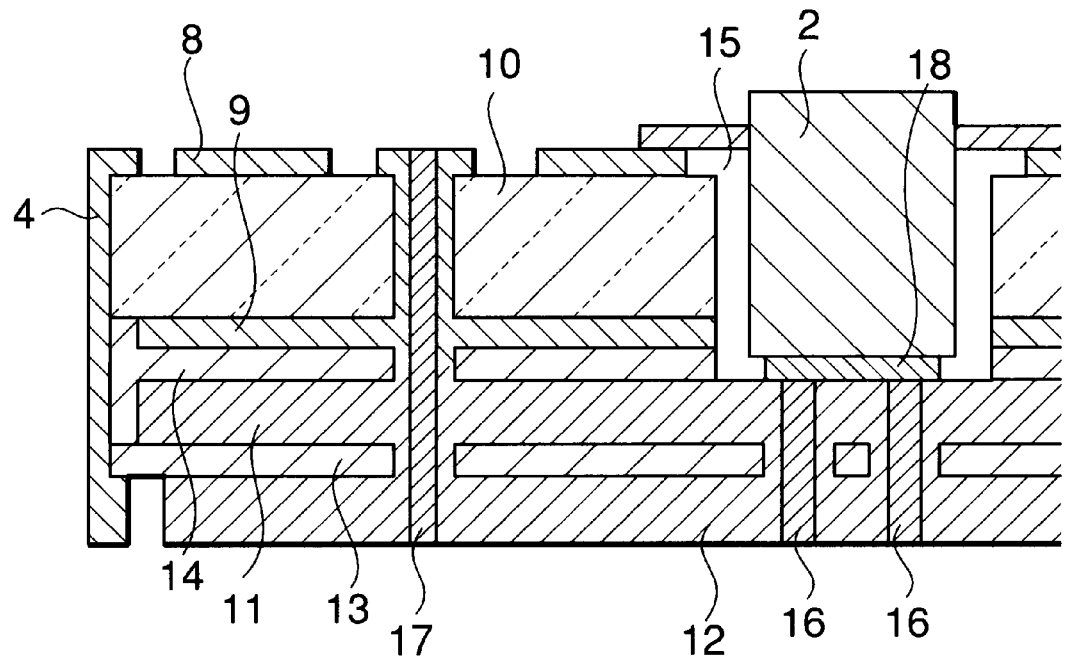
FIG. 1(c) is an cross sectional view of a high-frequency integrated circuit device according to another example of the first embodiment of the present invention.
Figure 1D:
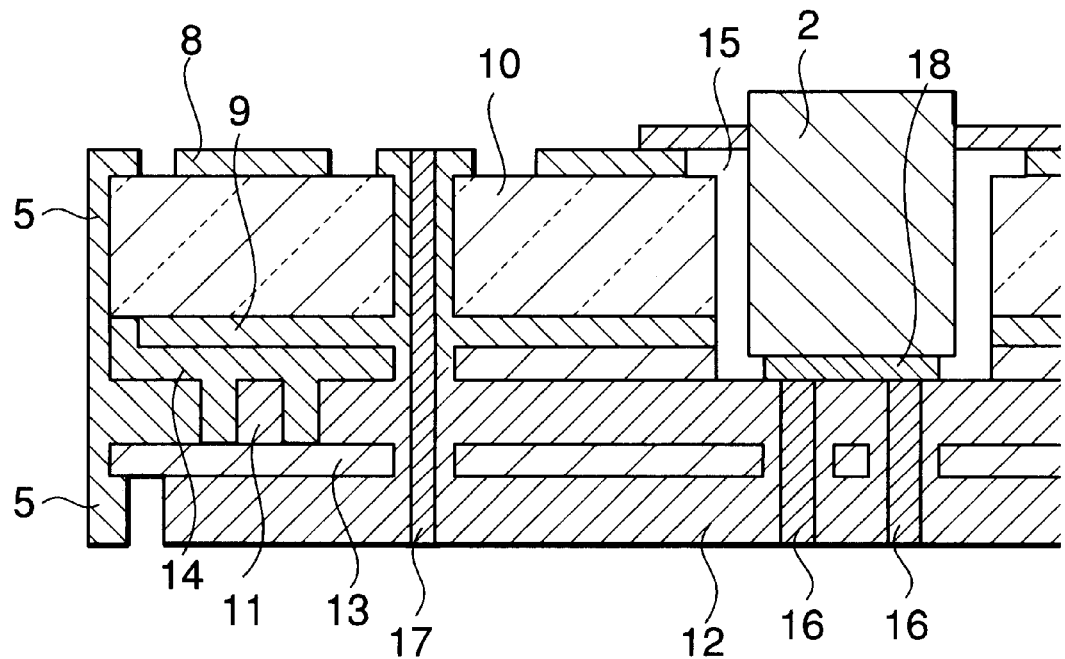
FIG. 1(d) is an cross sectional view of a high-frequency integrated circuit device according to another example of the first embodiment of the present invention.
Figure 1E:
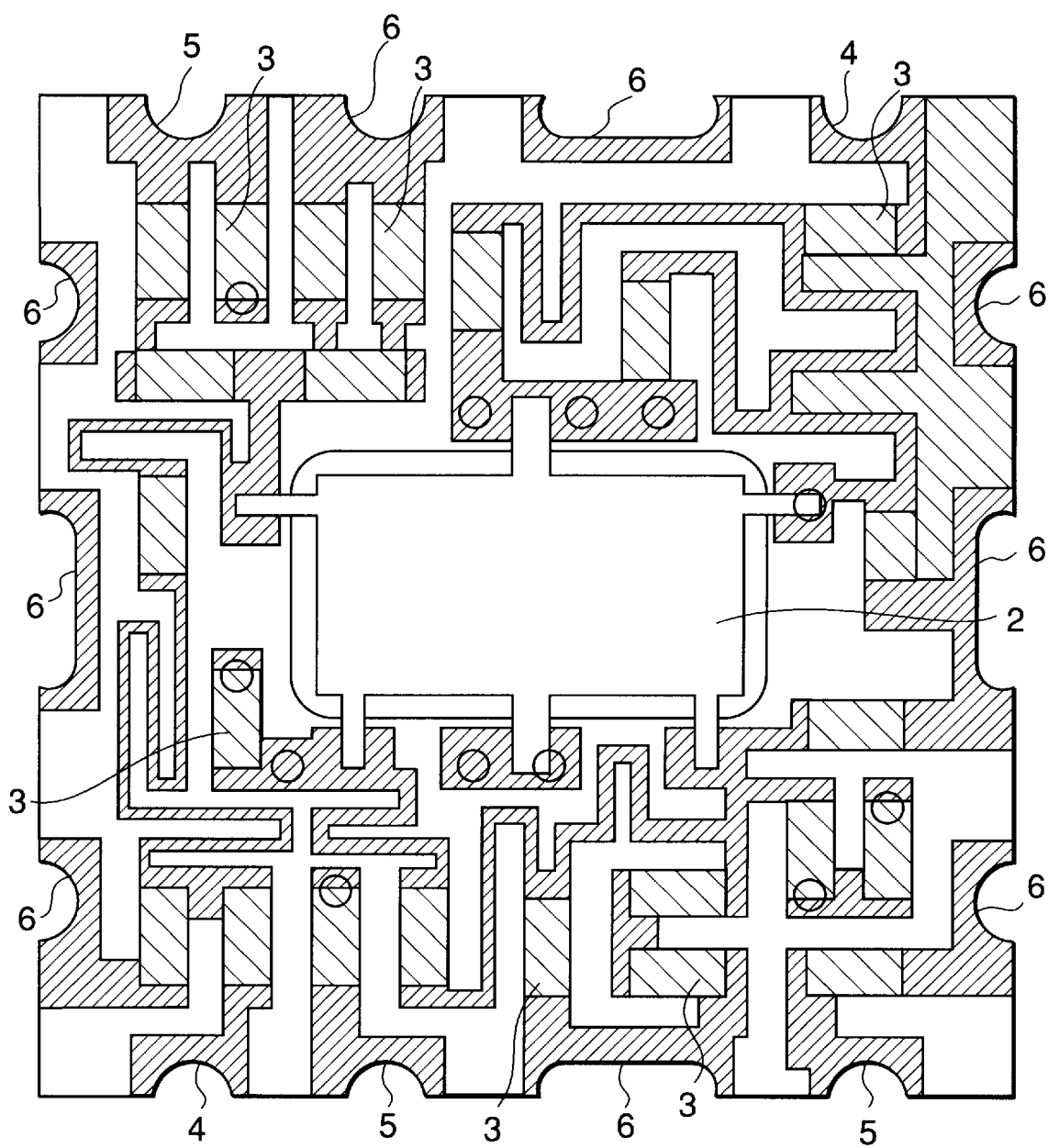
FIG. 1(e) is an example of a plan view of FIG. 1(b), 1(c), or 1(d)
Figure 1F:
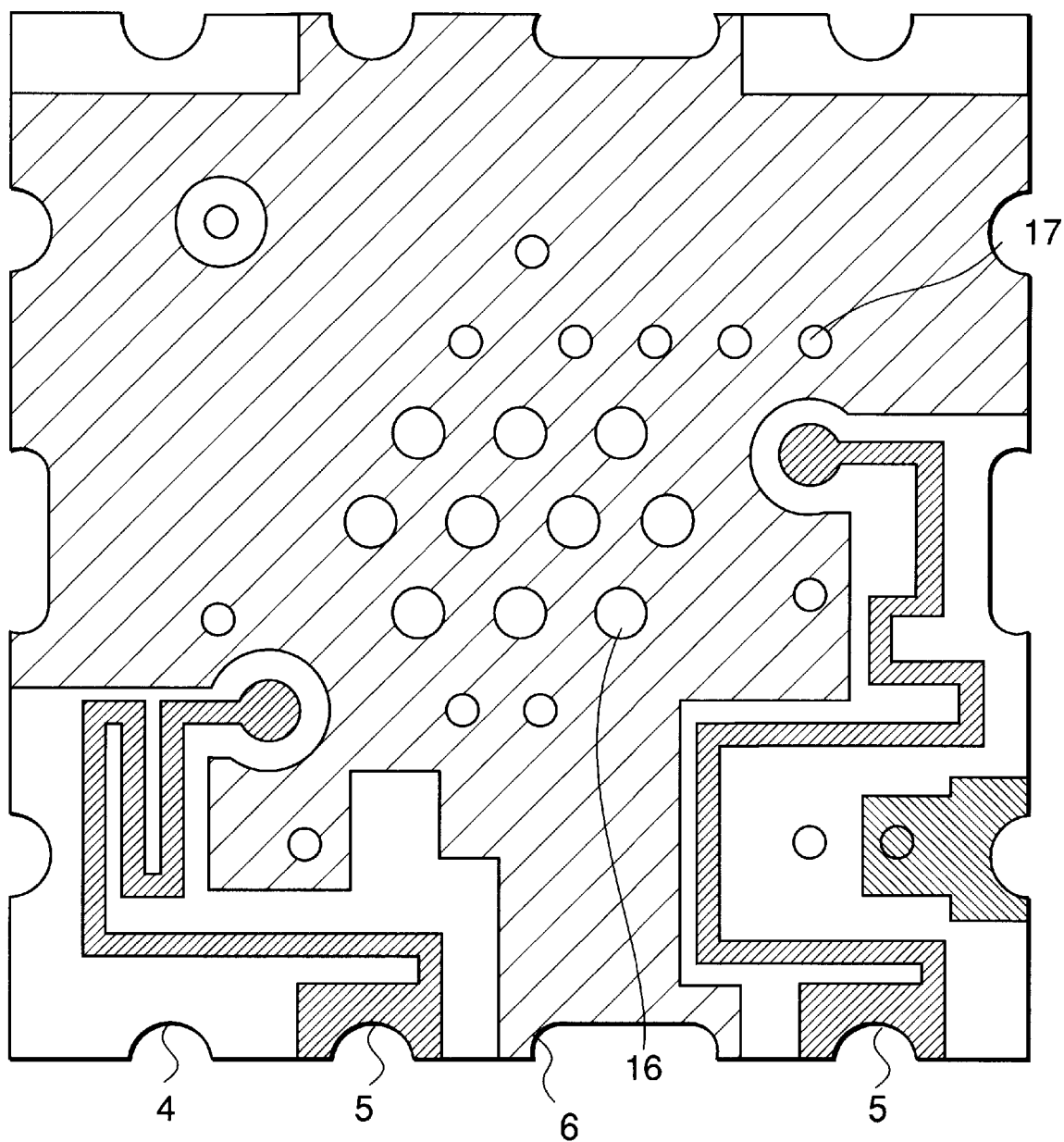
FIG. 1(f) is an example of a cross sectional plan view of FIG. 1(b), 1(c), or 1(d)

FIGS. 1(c) and 1(d) show additional examples of cross sectional views of the high-frequency integrated circuit device according to the first embodiment. As noted in the cross sections, the first and second metal layers 11 and 12 are patterned differently. Also, FIG. 1(e) is an example of a plan view of FIG. 1(b), 1(c), or 1(d), and FIG. 1(f) is an example of a cross sectional plan view of FIG. 1(b), 1(c), or 1(d) taken at the metal layer 11.

Figure 2:
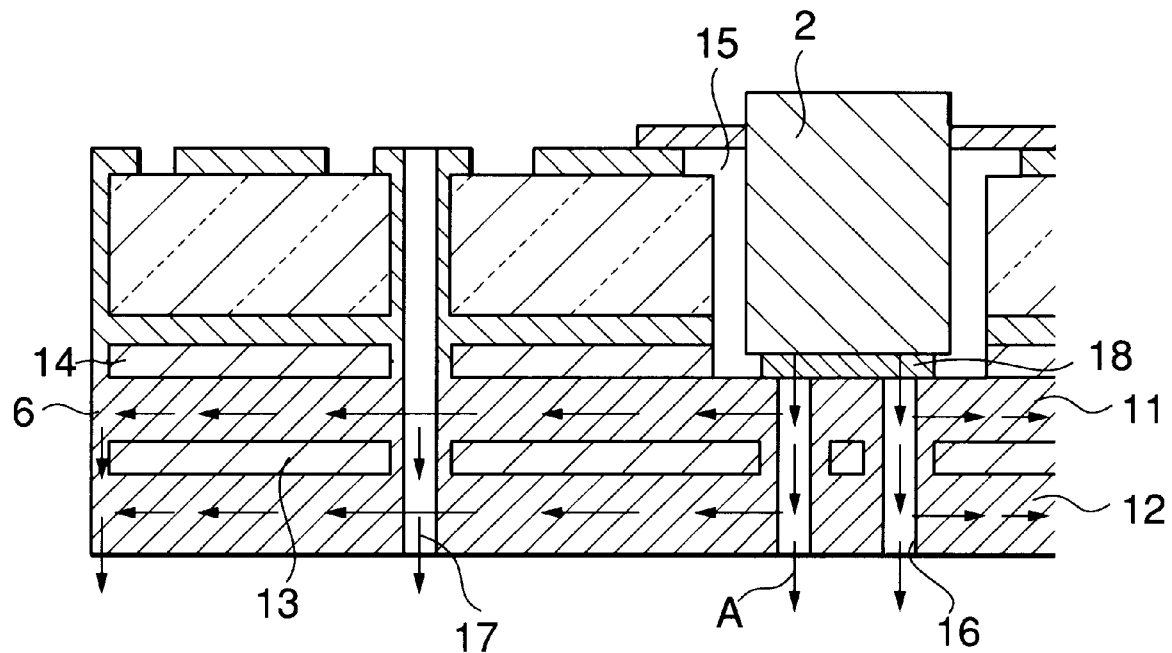
FIG. 2 is a cross sectional view illustrating the heat radiating characteristics of the device illustrated in FIGS. 1(a) and 1(b)

The heat radiating characteristics of the first embodiment will be described below in conjunction with FIG. 2. As shown in the figure, the heat generated by the power device element 2 mounted in the cavity 15 is directly transmitted to the metal layer 11 and to the through holes 16. (In FIG. 2, the directions in which the heat flows are shown by arrows A). Then, some of the heat transmitted to the through holes 16 is transmitted to the metal layer 11, to the metal layer 12, and to the atmosphere (or to a mounting substrate of a cellular phone or similar device). Some of the heat transmitted from the device 2 or from the holes 16 to the metal layer 11 is diffused in a transverse direction (i.e. the horizontal direction in FIG. 2) in the metal layer 11 to the though holes 6 and 17. Afterwards, the heat transmitted to the through holes 6 and 17 is transmitted through the holes 6 and 17 to metal layer 12 and to the atmosphere (or a mounting substrate). The heat transmitted to the metal layer 12 is diffused in the transverse direction in the metal layer 12 and transmitted to the through holes 6 and 17 and to the atmosphere (or the mounting substrate) via the through holes 6 and 17.

As shown above, the heat emitted from the power device 2 is transmitted from the cavity 15 to the through holes 16, the metal layer 11, and the metal layer 12. The metal layer 11 has a thickness which is greater than or equal to 50 $\mu$m, and thus, the heat received from the device 2 and the cavity 15 is directly and efficiently absorbed by the layer 11, diffused in the transverse direction, and conducted to the through holes 6 and 17. Also, the through holes 16 simultaneously transmit the heat away from the power element device 2 to the atmosphere and the metal layer 12, and the through holes 6 and 17 similarly transmit heat to the metal layer 12. The metal layer 12 has a thickness greater than or equal to 50 $\mu$m, and thus, the heat received from the through holes 6, 16, and 17 is directly and efficiently absorbed, diffused in the transverse direction, and conducted to the through holes 6 and 17.

As explained above, the multilayer substrate 1 provides numerous avenues through which the heat from the power element device 2 can be quickly diffused and dispersed away from the element 2, and thus, the heat resistance of the substrate 1 is dramatically reduced. Furthermore, the multilayer structure 1 is a laminate structure which can be efficiently manufactured at a low cost.

Figure 3:
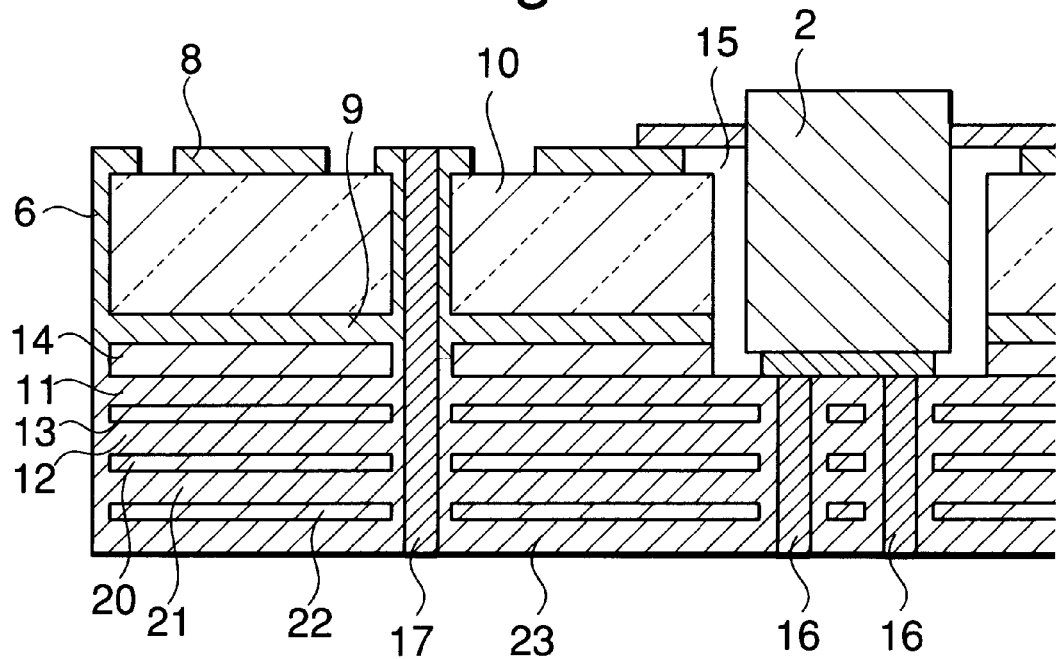
FIG. 3 is a cross sectional view of a high-frequency integrated circuit device according to a second embodiment of the present invention.
Figure 4:
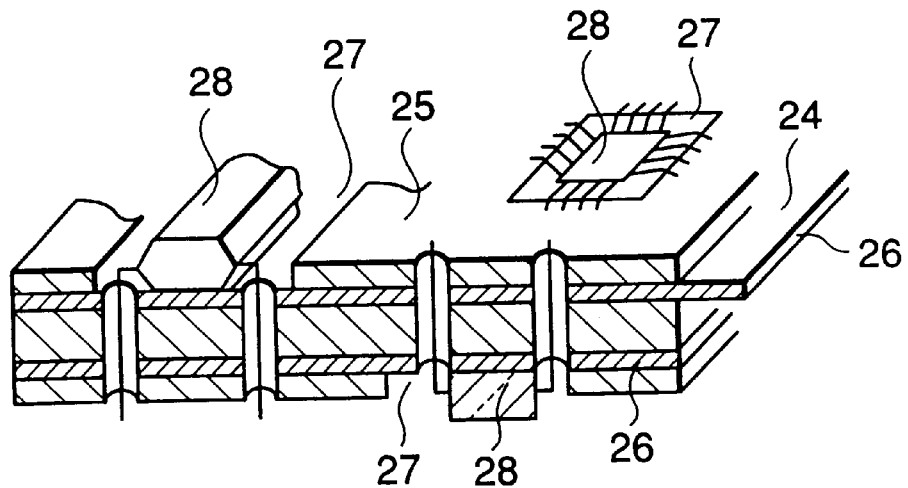
FIG. 4 is a perspective cross sectional view of a first conventional high-frequency integrated circuit device.
Figure 5:
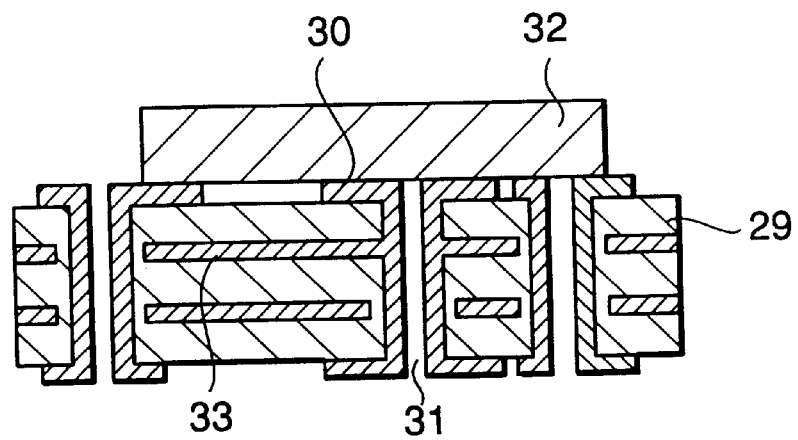
FIG. 5 is a cross sectional view of a second conventional high-frequency integrated circuit device.
Figure 6:
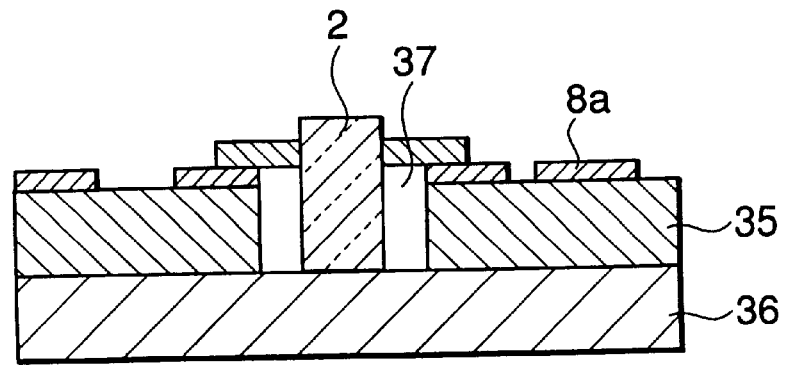
FIG. 6 is a cross sectional view of a third conventional high-frequency integrated circuit device.

FIG. 3 is a cross sectional view of a high-frequency integrated circuit device according to a second embodiment of the present invention. The second embodiment is similar to the first embodiment except that two additional metal layers 21 and 23 (each having a thickness of 50 µm), an additional base material layer 22, and an additional adhesive layer 20 are provided. The adhesive layer 20 is laminated to the metal layer 12, and the metal layer 21 is adhered to the adhesive layer 20. Also, the base material layer 22 is laminated to the metal layer 21, and the metal layer 23 is laminated to the base material layer 22.

In the present embodiment, the number of interlayers is increased since the base material layer 22 is added. Also, the heat radiating characteristics of the second embodiment are excellent and are similar to those of the first embodiment.

In order to further illustrate the concepts of the present invention, a detailed example of the first embodiment will be described below. In the example, the multilayer substrate 1 shown in FIG. 1(a) is 10.0 mm long, 10.0 mm wide and 0.8 mm thick. Also, the power device element 2 mounted on the multilayer substrate 1 has an output power of 1.1 W, and a chip resistor 3, chip capacitor 3, and other chip components 3 are mounted on the substrate 1. Also, in the side surface of the substrate, two input/output terminal through holes 4, three power terminal through holes 5, and nine radiating terminal through holes 6 are formed. Afterwards, a metal cover 7 made of brass is secured over the entire substrate 1 to protect the substrate 1. The entire assembled module is 10.0 mm long, 10.0 mm wide, and 2.0 mm high and thus, has a total volume of 0.2 cm$^3$.

Also the method for forming the multilayer substrate 1 is as follows. The base material layer 10 is made of glass epoxy, has a thickness of 300 µm, and has a dielectric constant of 10.5. Then, the conductor circuit layers 8 and 9 are disposed on the upper and lower faces of the base material layer 10, and each has a thickness of 18 µm. Afterwards, the layers 8 and 9 are etched to form particular wiring patterns.

Similarly, the base material layer 13 is made of glass epoxy, has a thickness of 100 µm, and has a dielectric constant of 4.2. Then, the metal layers 11 and 12 are respectively formed on the upper and lower faces of the layer 13 and are made of copper, and each has a thickness of 70 µm. In order to optimally disperse heat, the layers 11 and 12 should preferably have a thickness of greater than or equal to 50 µm. Afterwards, the layers 11 and 12 are etched to form particular wiring patterns.

With respect to the base material layer 10 on which high-frequency circuits are mounted, a glass epoxy having a high dielectric constant suitable for a strip line may be used. However, in the present example, an inexpensive glass epoxy having a typical dielectric constant is used because the base material layer 13 is provided as an inner layer of the multilayer substrate 1.

Subsequently, the adhesive layer 14 made of a glass epoxy system is sandwiched between the conductor circuit layer 9 and the metal layer 11. The layer has a thickness of 150 µm and a dielectric constant of 4.2. When the layer 14 is initially sandwiched between the layers 9 and 11, it is soft. However, when the layer is processed (e.g. a heat process), the layer 14 becomes hard and is similar to the base material layer 13.

After processing the adhesive layer 14, through holes 17 are drilled through the layers 8–14. Specifically, eleven through holes 17 having a diameter of 0.3 mm are formed through all of the layers of multilayer substrate 1. Then, the cavity 15 is formed in a center portion on a surface of the substrate 1 by performing a counter-boring operation until the metal layer 11 of copper is exposed. The cavity 15 is 2.7 mm long and 4.9 mm wide. Afterwards, the through holes 16 are drilled from the bottom of the cavity 15 through the metal layer 12. In particular, nine through holes 16 having a diameter of 0.5 mm are formed through the metal layers 11 and 12. Then, copper is sputtered in the inner surfaces of the through holes 16 and 17, and the holes 16 and 17 are filled with an insulator (i.e. a dielectric, ink, metal, etc.).

Afterwards, copper is sputtered on the upper surface of the layer 8 and the lower surface of the layer 12 while using a mask so that short circuits are not formed on the wiring patterns formed by the layers 8 and 12. Then, the surfaces of the layers 8 and 12 are covered with a dielectric.

Subsequently, solder 18 is placed at the position within the cavity at which the power device element is to be located. Also, solder is placed at the positions on the layer 8 at which the circuit components 3 are to be located. Then, the power device element 2 is placed on the solder 18 in the cavity 15, the components 3 are placed on the solder on the layer 8, and the solder is heated and cooled to mount the element 2 and components 3 on the substrate 1.

Afterwards, a cleaning process is performed to clean the device and a dielectric may be placed over the power device element 2 so that it does not move within the cavity 15. Then, the cover 7 is placed over the multilayer substrate 1.

As illustrated above, the various embodiments of the present invention provide numerous avenues for efficiently radiating a substantial amount of heat away from the power device element 2. Therefore, the embodiments minimize the heat resistance in the substrate and prevent the power device element 2 from being thermally destroyed.

According to the high-frequency multilayer substrate of the present invention, the radiating through holes are provided on the metal layer at the bottom of the cavity in which the power device element is mounted. Therefore, superior heat radiating characteristics are obtained, and a module having a volume of about 0.2 cm$^3$ can be created at a relatively low cost.

The previous description of the preferred embodiments is provided to enable a person skilled in the art to make or use the present invention. Moreover, various modifications to these embodiments will be readily apparent to those skilled in the art, and the generic principles defined herein may be applied to other embodiments without the use of inventive faculty. Therefore, the present invention is not intended to be limited to the embodiments described herein but is to be accorded the widest scope as defined by the claims.

What is claimed:

1. A device comprising:
   a multilayer substrate including a first portion and a second portion attached to said first portion,
   said first portion comprising a first base material layer having a first main surface and a second main surface opposite to said first main surface, and a first conductor layer formed on said first main surface,
   said second portion comprising a second base material layer having a third main surface and a fourth main surface opposite to said third main surface, a first metal layer formed on said third main surface, a second metal layer formed on said fourth main surface, and at least a first through hole selectively formed in said second base material layer to connect a part of said first metal layer to a part of said second metal layer therethrough, said first portion being attached to said second portion with an intervention of said first metal layer, a recessed cavity selectively formed in said first portion of said multilayer substrate to expose at least a surface of said first through hole, a power device element generating heat and being mounted in said recessed cavity on the surface of said first through hole, said first through hole thereby operating as a heat-radiating through hole such that the heat generated by said power device element is transmitted to and diffused into both of said first and second metal layers via said first through hole.

2. The device as claimed in claim 1, wherein said first portion further comprises a second conductor layer formed on said second main surface of said first base material layer, said first portion being attached to said second portion with an intervention of said second conductor layer and said first metal layer.

3. The device as claimed in claim 2, wherein said first base material layer has a first dielectric constant and said second base material layer has a second dielectric constant that is lower than the first dielectric constant.

4. The device as claimed in claim 1, wherein each of said first and second metal layers is greater in thickness than said first conductor layer.

5. The device as claimed in claim 1, wherein said multilayer substrate further includes a second through hole selectively formed therein, said second through hole penetrating each of said first and second base material layer to connect a part of said first conductor layer, another part of said first metal layer and another part of said second metal layer to one another, the heat diffused into said first and second metal layers from said power device element is further transmitted to said second through hole.

6. The device as claimed in claim 1, wherein said multilayer substrate further includes a side-surface through hole to connect at least a portion of a side-surface of said first metal layer and a portion of a side-surface of said second metal layer to each other.

7. The device as claimed in claim 6, wherein said side-surface through hole is provided to further connect a portion of a side-surface of said first conductor layer.

8. The device as claimed in claim 1, wherein said second portion of said multilayer substrate further comprising at least one third metal layer embedded in said second base material layer in isolation from said first and second metal layers, and said first through hole is formed to further connect a part of said third metal layer to each of the parts of said first and second metal layers, the heat generated by said power device element is thereby further transmitted to and diffused into said third metal layer.

9. The device as claimed in claim 1, wherein the first metal layer is supplied with an electrical potential which is further supplied to said second metal layer through said first through hole.

10. A device comprising:
a multilayer substrate including a plurality of composite layers, wherein a first composite layer is attached to a second composite layer;

said first composite layer further comprising:
a first base material layer having a first main surface and a second main surface opposite to said first main surface,
a first conductor layer, including a plurality of contiguous wiring conductor leads, formed on said first main surface,
a second conductor layer, also including a plurality of contiguous wiring conductor leads, formed on said second main surface of said first base material layer; and said second composite layer further comprising:
a second base material layer having a third main surface and a fourth main surface opposite to said third main surface,
a first metal layer formed on and substantially covering said third main surface, said first metal layer acting to dissipate heat generated thereupon,
a second metal layer formed on and substantially covering said fourth main surface, said second metal layer also acting to dissipate heat generated thereupon;

said first composite layer and said second composite layer being attached by an intersection of said second conductor layer and said first metal layer, with an adhesive insulating layer disposed therebetween;

at least a first through hole selectively formed in said second base material layer to connect a part of said first metal layer to a part of said second metal layer therethrough;

a recessed cavity selectively formed in said first composite layer of said multilayer substrate to expose at least a surface of said first through hole, a power device element generating heat and being mounted in said recessed cavity on the surface of said first through hole, said first through hole thereby operating as a heat-radiating through hole such that the heat generated by said power device element is transmitted to and diffused into both of said first and second metal layers via said first through hole.

11. The device as claimed in claim 10, wherein said first base material layer has a first dielectric constant and said second base material layer has a second dielectric constant that is lower than the first dielectric constant.

12. The device as claimed in claim 10, wherein each of said first and second metal layers is greater in thickness than said first conductor layer.

13. The device as claimed in claim 10, wherein said multilayer substrate further includes a second through hole selectively formed therein, said second through hole penetrating each of said first and second base material layers to connect a part of each of said first conductor layer, said second conductor layer, said first metal layer, and said second metal layer to one another, the heat diffused into said first and second metal layers from said power device element being further transmitted to said second through hole.

14. The device as claimed in claim 10, wherein said multilayer substrate further includes a side-surface through hole to connect at least a portion of a side-surface of said first metal layer and a portion of a side-surface of said second metal layer to each other.

15. The device as claimed in claim 14, wherein said side-surface through hole is provided to further connect a portion of a side-surface of said first conductor layer.

16. The device as claimed in claim 10, wherein said second composite layer of said multilayer substrate further comprises at least one third metal layer embedded in said second base material layer in isolation from said first and second metal layers, and said first through hole is formed to further connect a part of said third metal layer to each of the parts of said first and second metal layers, the heat generated by said power device element is thereby further transmitted to and diffused into said third metal layer.

17. The device as claimed in claim 10, wherein the first metal layer is supplied with an electrical potential which is further supplied to said second metal layer through said first through hole.

* * * * *